United States Patent [19]
Tani

[11] Patent Number: 6,129,014
[45] Date of Patent: Oct. 10, 2000

[54] APPARATUS AND METHOD FOR SCREEN PRINTING OF PASTE

[76] Inventor: Okie Tani, Miyoshi 3-10-3, Koto-ku, Tokyo 135-0022, Japan

[21] Appl. No.: 09/235,012

[22] Filed: Jan. 21, 1999

[30] Foreign Application Priority Data

Jan. 21, 1998 [JP] Japan ................................. 10-023913

[51] Int. Cl.⁷ ..................................................... B41F 15/18
[52] U.S. Cl. ............................................ 101/126; 101/129
[58] Field of Search ..................................... 101/123, 126, 101/127.1, 129

[56] References Cited

U.S. PATENT DOCUMENTS

| | | | |
|---|---|---|---|
| 5,174,201 | 12/1992 | Andris et al. | 101/129 |
| 5,450,789 | 9/1995 | Hasegawa | 101/129 |
| 5,623,872 | 4/1997 | Tomomatsu | 101/126 |
| 5,735,203 | 4/1998 | Taniguchi et al. | 101/126 |

FOREIGN PATENT DOCUMENTS

| 75148 | 3/1991 | Japan | 101/129 |
|---|---|---|---|

*Primary Examiner*—Stephen R. Funk

[57] ABSTRACT

An apparatus for printing paste onto a surface of a printed circuit board through a screen having openings therein. The apparatus comprises a holder for holding the screen (5) horizontally in position, a vertically movable printing table (3) carrying the board (4) thereon a mechanically drivable squeegee device (1) for filling paste into openings (7) in the screen as the surface of the board is in contact with a lower surface of the screen (5), a drive for moving the printing table between a lower position, a raised printing position where printing of the board occurs and a higher third position higher than the printing position. The printing table (3) acts to push the screen upwardly, as it is raised from the printing position, so as to cause the screen to be elastically deformed into a substantially arcuate form so that the screen and the board are substantially separated from each other and printed paste deposits (8) are left on the board at the higher third position. Spacers (10) or (10') are provided for maintaining the screen separated from the printed paste deposits on the board until the printing table is lowered to the lower position.

2 Claims, 8 Drawing Sheets

PRIOR ART

APPARATUS AND METHOD FOR SCREEN PRINTING OF PASTE

BACKGROUND OF THE INVENTION

1. Field of the Invention

The present invention relates generally to an apparatus and method for printing paste onto a surface through a screen having a plurality of openings therein, and more particularly to an apparatus for and method of printing solder paste onto a surface of a printed circuit board through the screen that is used in producing surface mount technology circuit boards suitable for use in high technology products.

2. Description of the Prior Art

There are various methods by which solder paste can be printed on a printed circuit board. One approach is to use a well known screen printing apparatus which has a spatula-like squeegee which is arranged to be displaced back and forth along a pair of guide rails and is arranged to be raised and lowered relative to the guide rails. The squeegee is adapted to be in pressure contact with an upper surface of the screen when it is lowered to a printing position where solder paste is printed onto a surface of a printed circuit board supported on a printing table. In this type of apparatus, a considerable amount of solder paste is supplied onto the screen prior to operating the apparatus and the solder paste supplied onto the screen is printed on the surface of the circuit board by reciprocating the squeegee, while its lower end is pressed against the screen to introduce the solder paste into openings of the screen.

Another type of a screen printing apparatus is also well known which comprises a viscous material automatic supply dispenser of the type having a housing of a closed box type in which a chamber for containing the material and a slit-like bottom aperture communicating therewith, having a leading side defined by a front wall and a trailing side defined by a rear wall and being arranged to be normally closed and to be kept open to automatically supply a predetermined amount of the material onto a surface of a board during printing.

In these known screen printing apparatuses, the printing table carrying the circuit board thereon is arranged to be moved between the two predetermined positions, a lower position and a raised printing position where printing of the circuit board occurs. As the paste is printed onto the board through the screen at the printing position, the board is caused to be separated from the lower surface of the screen by moving the printing table downwardly from the printing position to the lower position so that the pastes filled in the screen openings are pulled out and transferred onto the circuit board.

Figure 6:
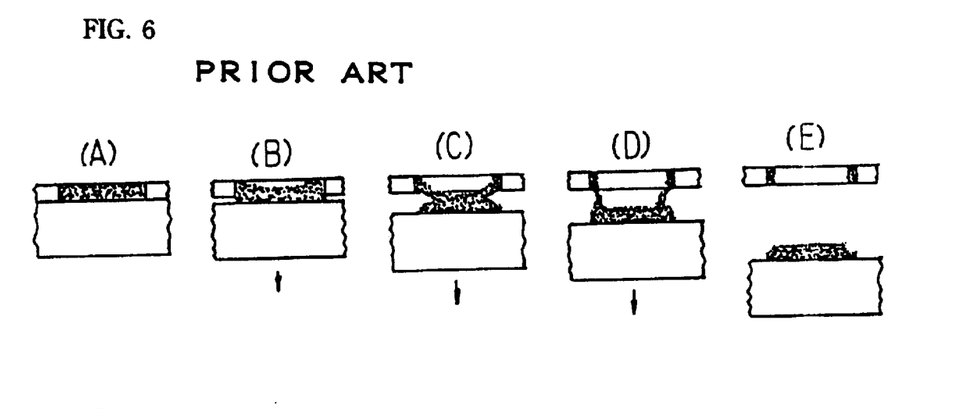
Figure 7:
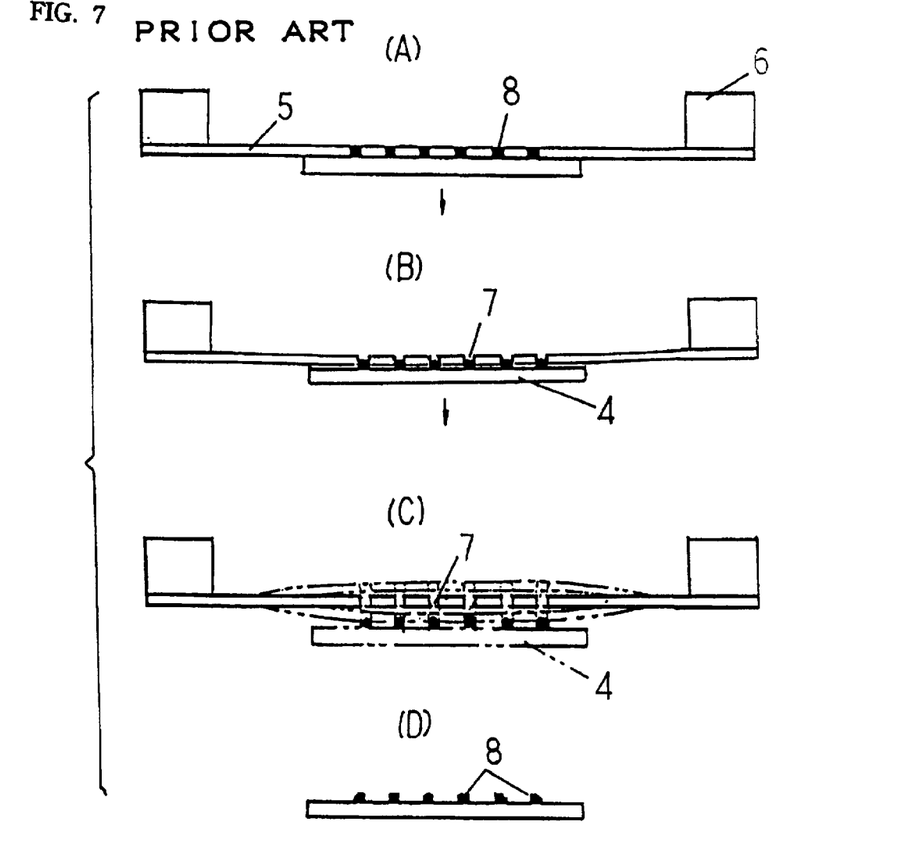
Figure 8:
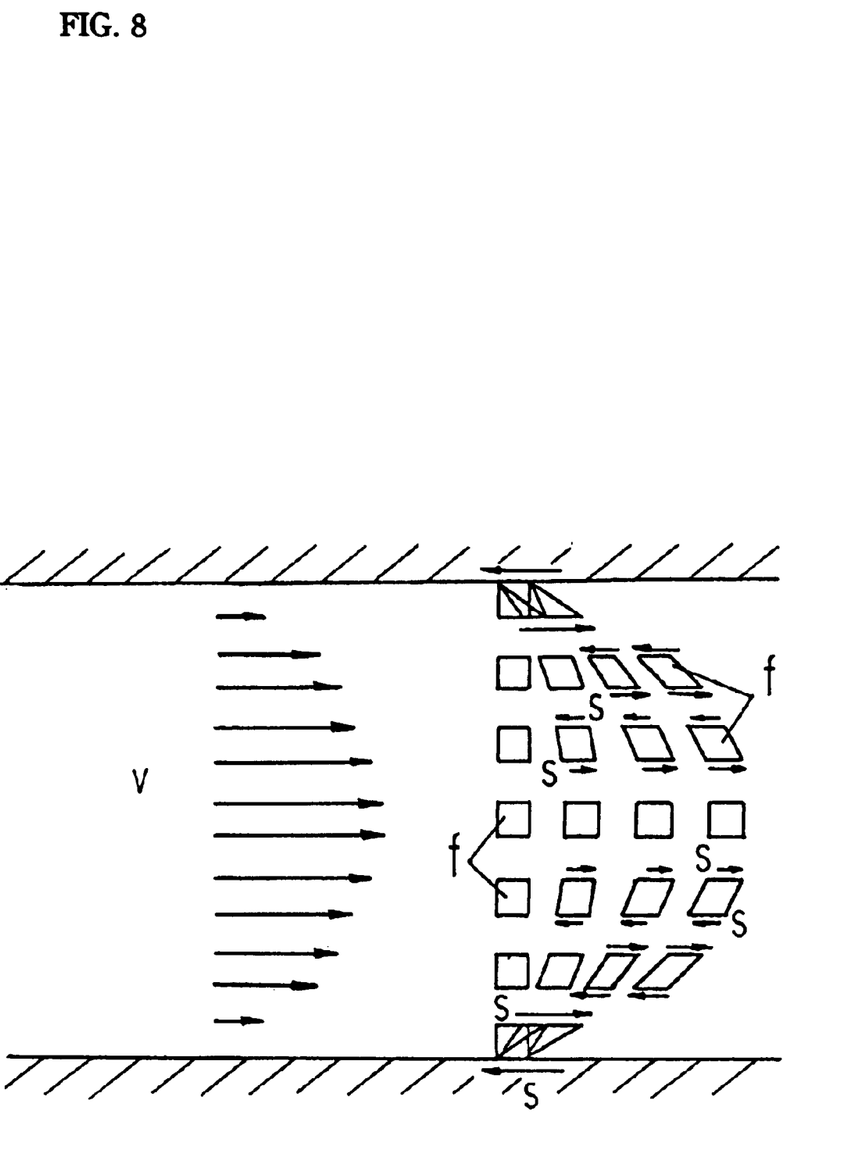
FIG. 8 is a diagram illustrating the state in which viscous fluid flows through a pipe, wherein principles on velocity distribution, actions and directions of shear force, etc. are indicated.

FIGS. 6 and 7 each illustrate a process of separating the circuit board 4 from the screen 5 and the manner in which the solder pastes 8 filled in openings 7 in the screen 5 are pulled out and transferred onto the board in accordance with the known apparatuses and method for printing solder paste onto circuit boards through a screen. Solder paste normally has a high viscosity and when it is printed onto the circuit board 4 through the screen 5 at the printing position, the paste 8 in each opening 7 of the screen 5 is adhered to both inner peripheral surfaces of the opening and the upper surface of the circuit board 4 which is in contact with the lower surface of the screen 5, as shown in FIG. 6(A) and FIG. 7(A).

As the separation proceeds by displacing the printing table downwardly from the printing position, the paste 8 in each opening 7 is gradually extended downwardly in the state in which the central portion of the paste 8 is deformed into concave, as illustrated in FIGS. 6(B)~(D) and FIG. 7(B). At the same time, the screen 5 held by a screen holder 6 in a tensioned state is downwardly pulled, since it is adhered to the board 4 through the medium of the paste 8, and is caused to be gradually elastically deformed downwards, thereby storing repulsive energy therein (FIG. 7(B)). Then, as their separation proceeds further and the paste in each screen opening 7 is pulled out and transferred onto the board 4, the elastically deformed screen 5 springs up by its repulsive force or spring action and then makes up and down movements or vibrations for a while, as illustrated in FIG. 7(C). These movements or vibrations of the screen 5 tend to make the screen come into contact with the printed paste 8 on the circuit board 4. As a result, as shown in FIG. 6(E) and FIG. 7(D), print pattern of the printed paste is caused to be damaged.

One of other disadvantages indicated with the prior art is that when highly viscous solder paste or a screen having narrow openings therein is used for screen printing, the problem of clogging of the screen openings is experienced from time to time. FIG. 6(E) shows one example where a screen opening 7 is partly clogged by solder paste 8.

SUMMARY OF THE INVENTION

The present invention is intended to eliminate the disadvantages or drawbacks indicated with prior art as described above and to provide an improved apparatus and method for printing solder paste onto a surface of a printed circuit board through a screen having openings therein which is capable of performing a precise and high quality screen printing and which is particularly suited for use in mounting surface mounted components, such as semi-conductor chips, resistors and capacitors etc., on the printed circuit boards.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the screen printing apparatus and method of the invention is illustrated.

BRIEF DESCRIPTION OF DRAWINGS

FIGS. 5(A–E) are views illustrating a process of separating the board from the screen in the apparatus shown in FIG. 4A;

FIGS. 6(A–E) are views illustrating a process of separating the board from the screen in accordance with the prior art;

FIGS. 7(A–D) are views illustrating the manner in which the paste filled in the screen openings are pulled out in accordance with the prior art.

DETAILED DESCRIPTION

Referring to FIGS. 2, 2A, 4 and 4A, reference numeral 1 indicates a mechanically drivable squeegee device having a squeegee blade 1; 2 indicates a vertically movable table unit having at its top a printing table 3 on which a printed circuit board 4 to be printed is supported and 5 shows a screen formed of a metal plate, such as a stainless steel plate. Indicated by 6 is a screen holder for holding the screen 5 horizontally in a tensioned state. 6A indicates supporting plates for supporting the screen 5. Reference numeral 9 indicates drive means for moving the printing table 3 between a lower position, a raised printing position where printing of the circuit board 4 occurs and a higher third position which is higher than the raised printing position. 10 shows spacing means for maintaining the screen 5 separated from the printed paste on the circuit board 4 until the printing table 3 is lowered to said lower position.

The drive means 9 comprise servo motors 13 mounted on upright posts 12 fixed to a bed unit 11 and supporting the screen-supporting plates 6A, control rods 15 rotatably mounted on the bed unit 11 so as to be rotatable about vertical axes and arranged to be rotated by the servo motors 13 through the medium of endless belts 14 and a control plate 16 having threaded circular apertures 16A which are in threaded engagement with threaded portions 15A formed on the upper portions of the control rods 15, respectively. Indicated by 17 is a guide cylinder projecting vertically upwardly from the bed unit 11. 18 is a cylindrical support that is vertically inserted, by sliding, into the guide cylinder 17 and fixed, at its top, to the bottom of the printing table 3 to support the table 3.

Figure 1:
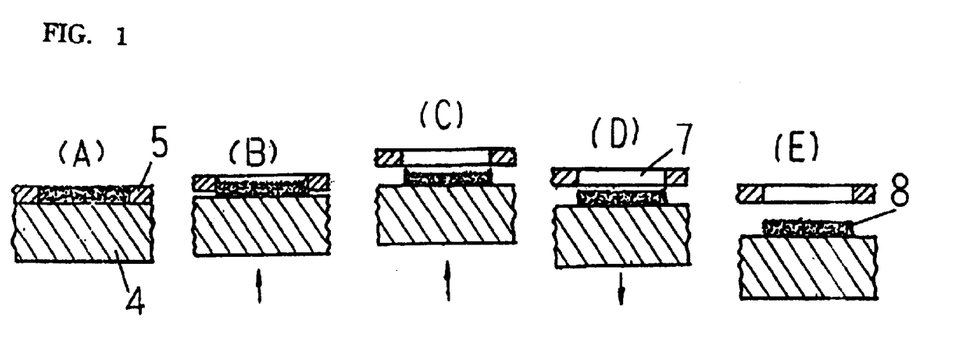
FIG. 1 is a view illustrating a process of separating the circuit board from the screen in accordance with the present invention.
Figure 2:
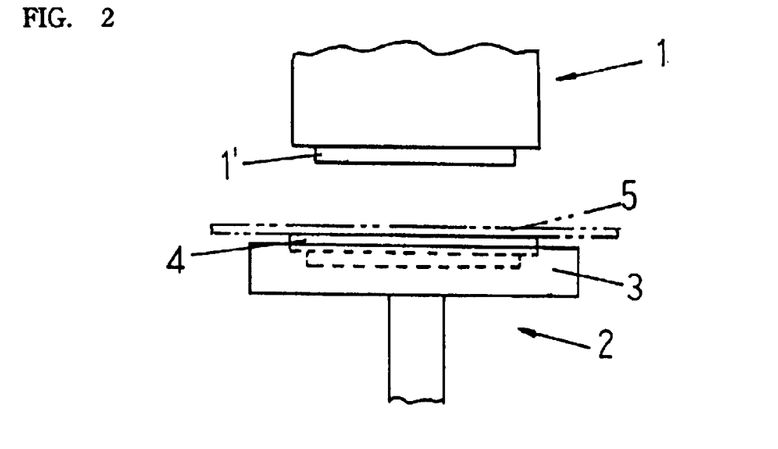
FIG. 2 is a schematic fragmentary front view of a screen printing apparatus as one embodiment of the present invention.
Figure 2A:
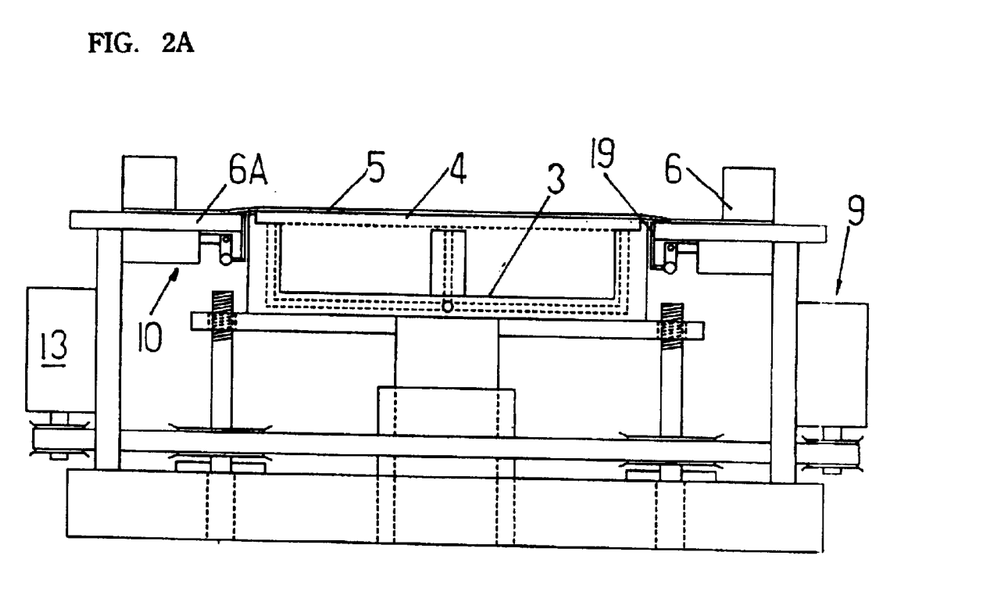
FIG. 2A is a front view of the apparatus shown in FIG. 2.
Figure 4:
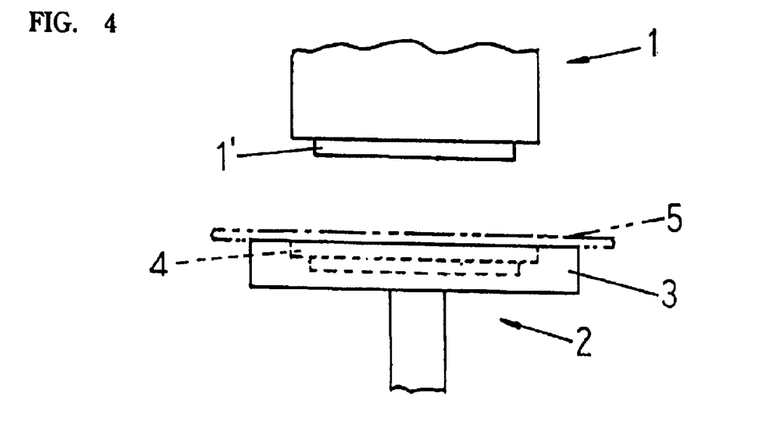
FIG. 4 is a similar view of FIG. 2, showing a variant of the apparatus shown in FIG. 2.
Figure 4A:
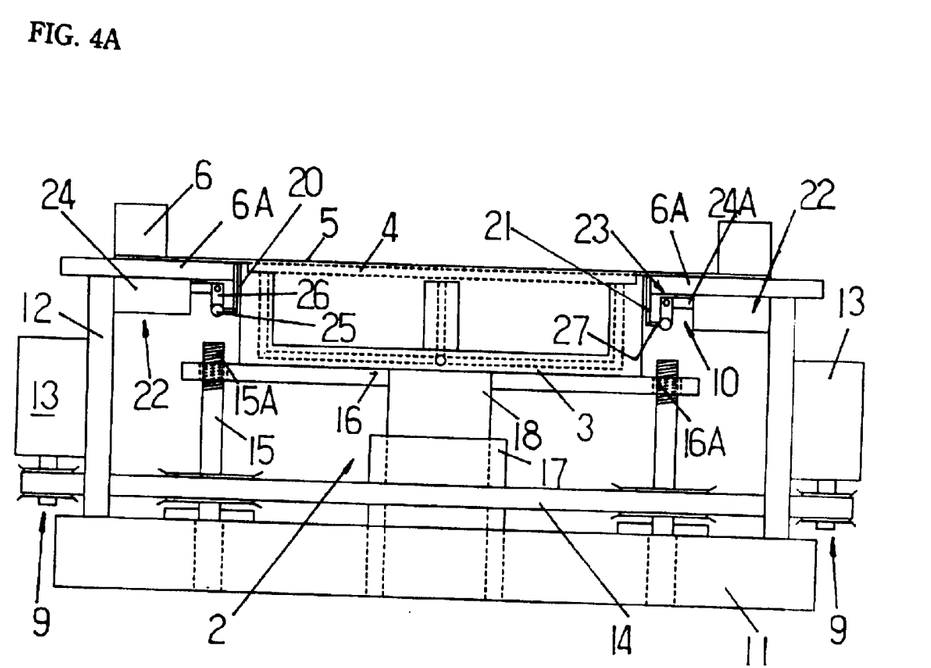
FIG. 4A is a front view of the apparatus shown in FIG. 4.

The spacing means 10 comprise two opposed push plates 21 capable of projecting upwardly through two slit-like apertures 19, 20 respectively formed between the printing table 13 and the screen-supporting plates 6A and two driving mechanisms 22 for moving the push plates 21 between a lower position and a raised screen-upholding position. Each of the driving mechanisms 22 comprises a piston and cylinder assembly 24 secured to the underside of each of the screen-supporting plates 6A and having a piston rod 24A and a connection 23 for operatively connecting the cylinder assembly 24 with said push plates 21. The connection 23 includes a driving arm 26 one end of which is pivoted to the piston rod 24 and the other end of which is connected to the lower end of push plate 21 by means of a pivot pin 25 and a supporting arm 27 projecting outwardly therefrom. Each of the push plates 21 is made of an elongated metal plate.

Figure 4B:
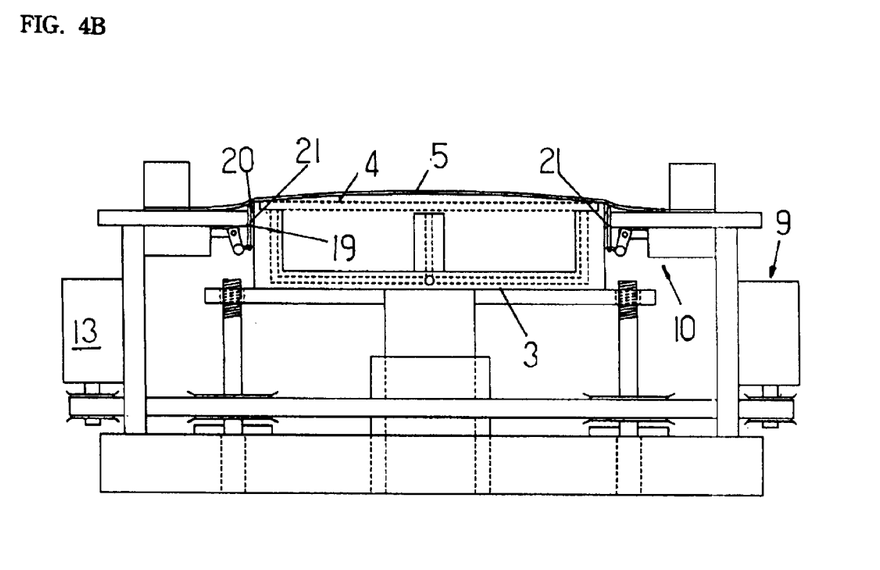
FIG. 4B is a similar view of FIG. 4A, showing the state in which the screen is pushed upwardly after screen printing of paste.
Figure 4C:
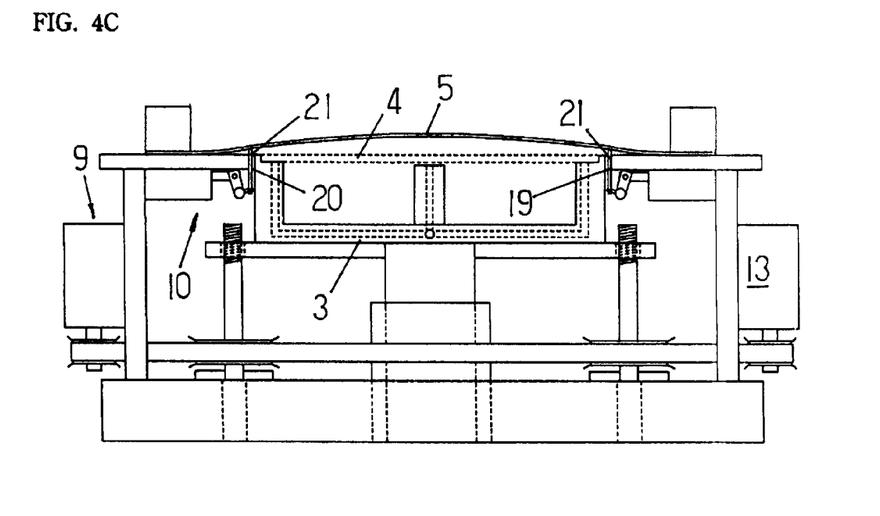
FIG. 4C is a similar view of FIG. 4B, showing the state in which the screen pushed upwardly is maintained in the raised position by spacing means.
Figure 4D:
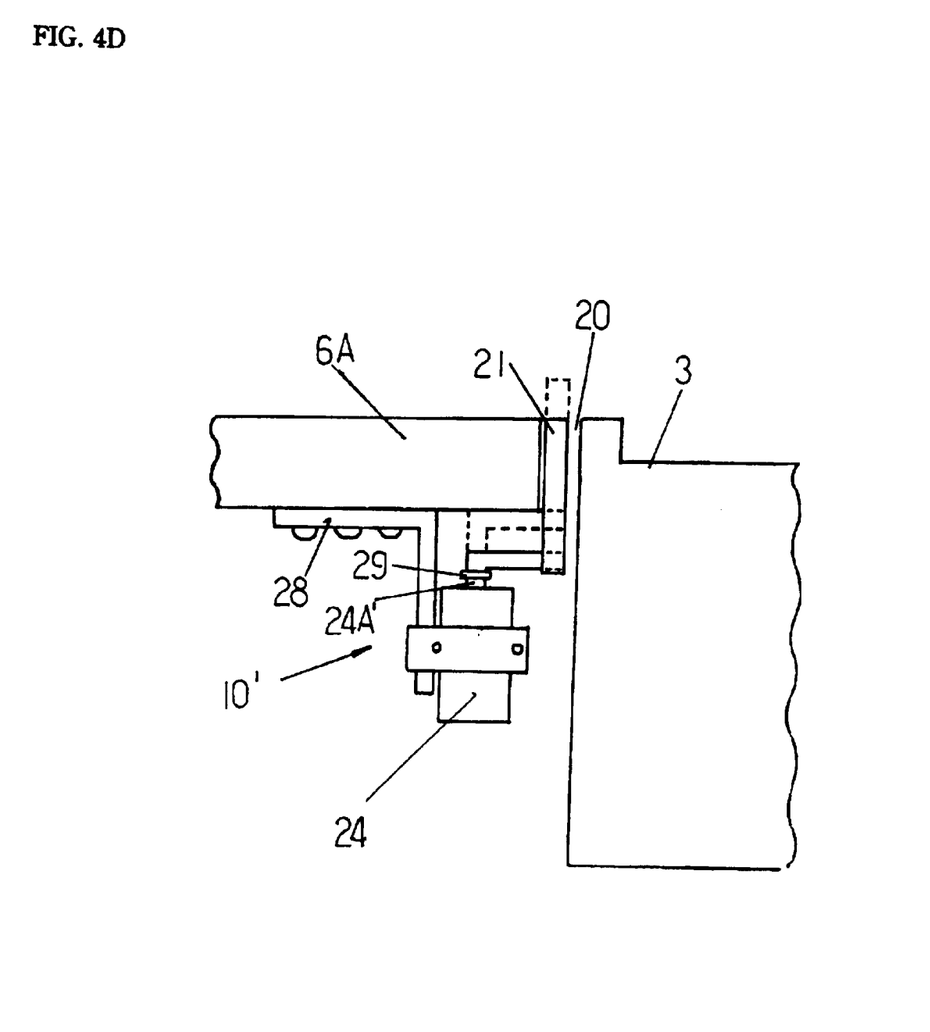
FIG. 4D is a variant of the spacing means.

FIG. 4D shows a variant 10' of the spacing means 10 employed in the apparatus shown in FIG. 2A and FIG. 4A. In the drawing in FIG. 4D, 28 is a bracket secured to the underside of each of the screen-supporting plates 6A. 24 is a piston and cylinder assembly fixed to the bracket 28. Piston rod 24A' which projects upwardly from the cylinder is bent at right angles and is provided, at its end, with a push plate 21 which is capable of projecting upwardly through the slit-like aperture. The spacing means 10', 10 as well as the aforementioned drive means 9 are arranged to be operated by means of a sequential control unit including a control circuit arrangement, not shown.

Figure 3:
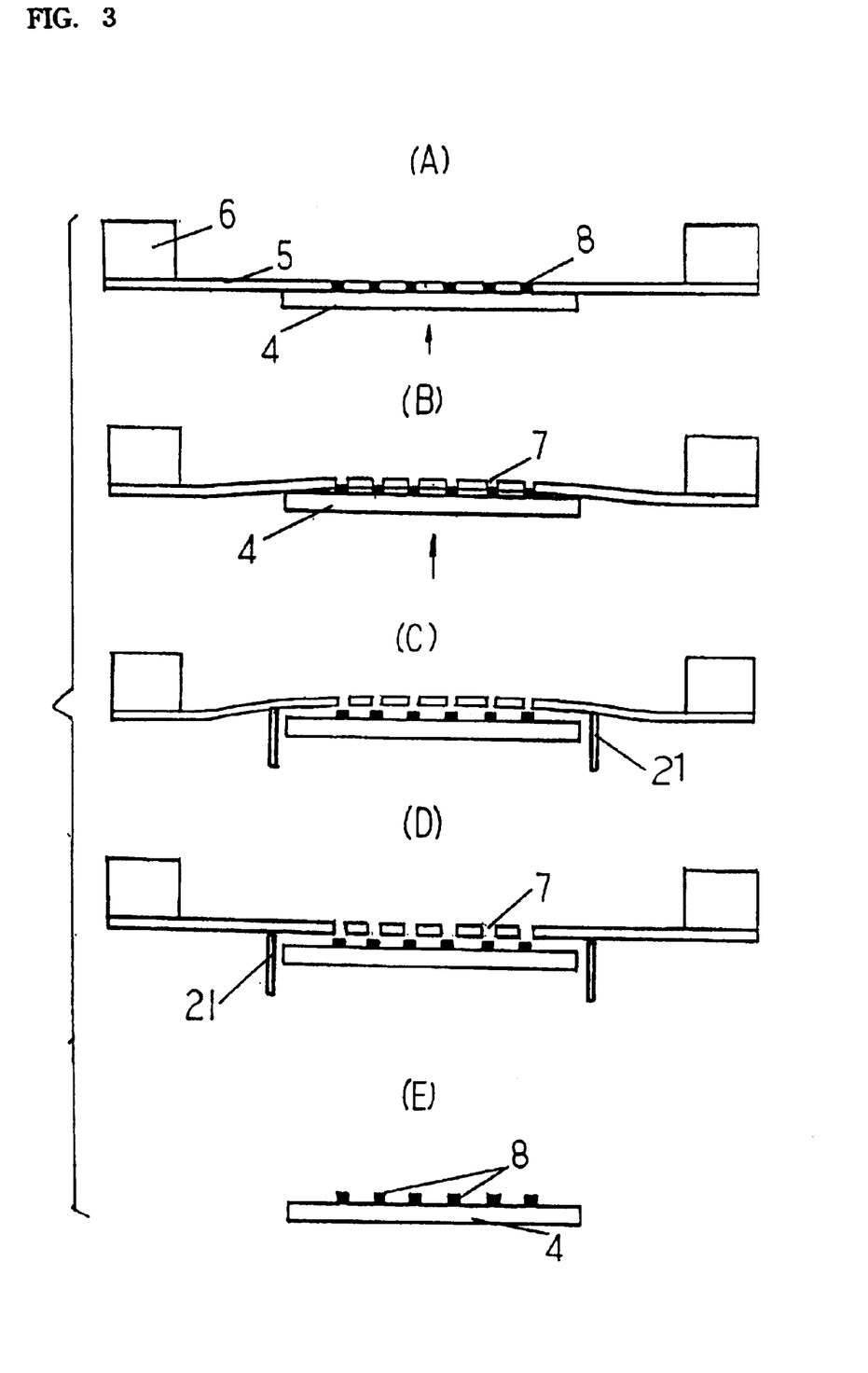
FIG. 3 is a view illustrating a process of separating the board from the screen in the apparatus shown in FIG. 2A.
Figure 5:
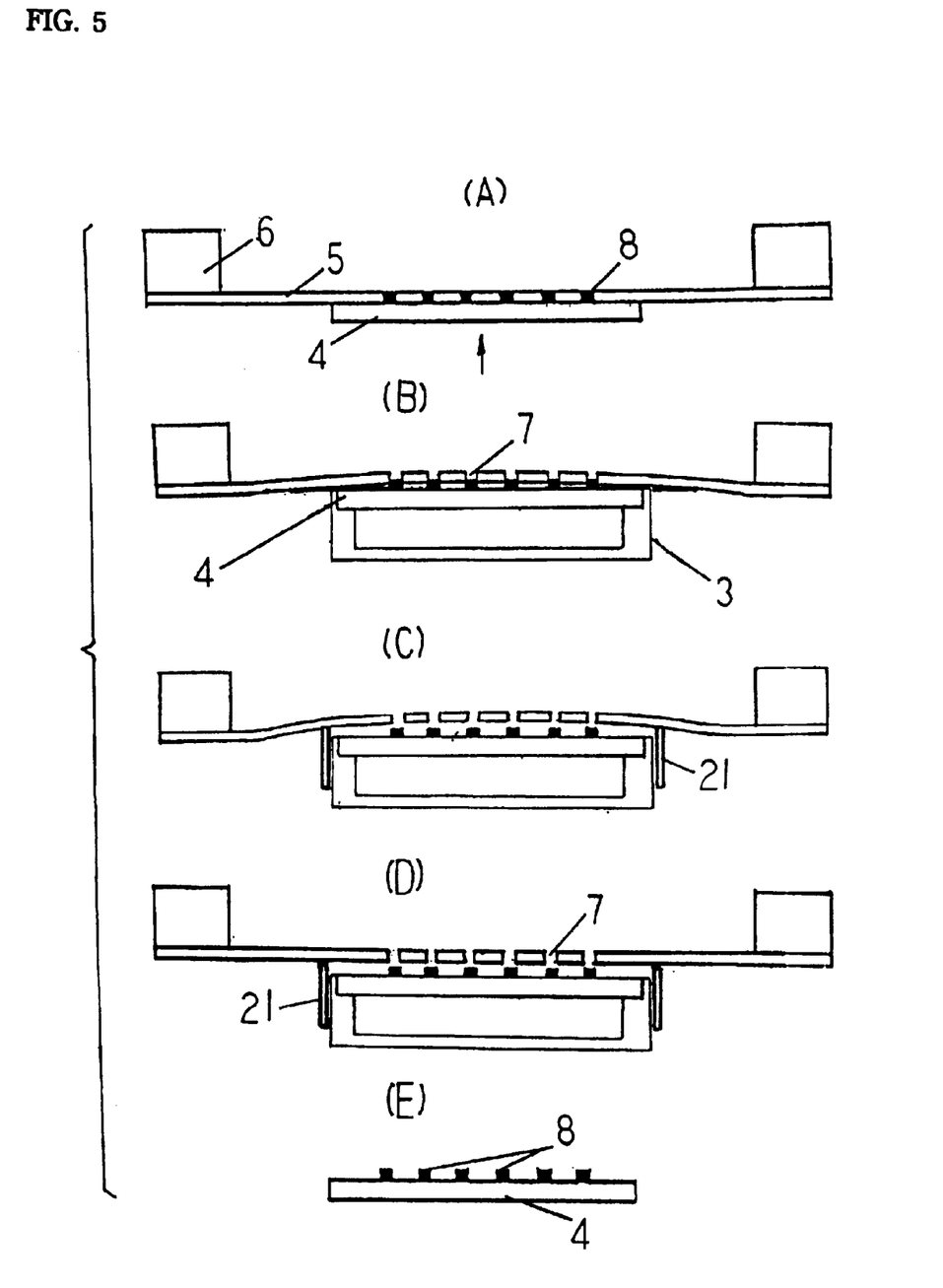

In the screen printing apparatus of the present invention as described above, as the screen 5 is raised from the printing position by the circuit board 4 (FIG. 3) or the printing table 3 (FIG. 5) after screen openings 7 have been filled with solder paste 8 by means of the squeegee blade 1' of squeegee device 1 at the printing position the screen 5 is caused to be gradually elastically deformed into a substantially arcuate form, as shown in FIGS. 3 (B) and 5 (B). Then, as the screen 5 is raised to the higher third position (FIGS. 4B and 4C) the screen 5 and the circuit board 4 are substantially separated from each other as shown in FIGS. 3 (C) and 5 (C). Next, as the screen 5 has been pushed up to the third position and separated from the printed deposits 8, the spacing means 10 or 10' are actuated to uphold the screen 5 with push plates 21 at the third position, as shown in FIG. 3 (C), FIG. 4B, FIG. 4C and FIG. 5 (C). This state continues until the printing table 3 is lowered to the lower position. Therefore, in this screen printing method, there occurs no danger that the screen 5 comes into contact with and damages the printed paste deposits 8 left on the circuit board 4.

After the printing table 3 has been lowered to the lower position, the push plates 21 are caused to be retracted into the slits 19, 20 by operation of the cylinder 24. In FIG. 4D, reference numeral 29 indicates an adjusting nut for adjusting stroke of the piston rod 24A'.

It will be understood from the foregoing description that one of the most important features of the present invention resides in that different from the prior art, the screen 5 is forcibly pushed up by the circuit board 4 or the printing table 3 so as to be arcuately deformed against the elasticity or spring action of the screen 5, thereby enabling the screen 5 and the circuit board 4 adhered to each other to be substantially separated from each other.

As the screen 5 is forcibly pushed up and arcuately elastically deformed, the inner peripheral surfaces of the screen opening 7 is acted upon by compressional waves, causing the increase in the fluidity of the solder paste filled in the screen openings. This means that according to the present invention, thixotropic properties of solder paste can be effectively utilized. Therefore, according to the present invention, even if extremely viscous solder paste (e.g. 800~1,200 cps) or a screen having therein very narrow openings is used for screen printing, clogging of the screen openings can be effectively prevented.

What is claimed is:

1. A screen printing apparatus for printing paste onto a surface of a printed circuit board through a screen comprising:

holding means for holding the screen horizontally in position;

a vertically movable printing table carrying the board thereon;

a mechanically drivable squeegee means for filling paste into openings in the screen as the surface of said board is in contact with a lower surface of the screen;

a drive means for moving said printing table between a lower position, a raised printing position where printing of the circuit board occurs and a higher third position higher than said printing position, said printing table acting to push the screen upwardly, as it is raised from the printing position, so as to cause the screen to be elastically deformed into a substantially arcuate form so that the screen and the board are substantially separated from each other and printed paste deposits are left on the board at the higher third position; and spacing means for maintaining the screen separated from the printed paste deposits on the circuit board until the printing table is lowered to said lower position.

2. A method for printing paste onto a surface of a printed circuit board through a screen comprising the steps of:

filling paste into openings in the screen placed on the circuit board carried on a printing table, said printing table being movable between a lower position, a raised printing position where printing of the circuit board occurs and a higher third position higher than said printing position; and moving the printing table upwardly so as to cause the screen to be elastically deformed into a substantially arcuate form so that the screen and the board are substantially separated from each other and printed paste deposits are left on the board at the higher third position.

* * * * *

UNITED STATES PATENT AND TRADEMARK OFFICE
CERTIFICATE OF CORRECTION

PATENT NO. : 6,129,014

DATED : October 10, 2000

INVENTOR(S) : Tani Okie

It is certified that error appears in the above-identified patent and that said Letters Patent is hereby corrected as shown below:

On the Title Page, Item [73] Assignee should read ----- Tani Denkikogyo Co., Ltd. ---.

Signed and Sealed this

Twenty-ninth Day of May, 2001

Attest:

NICHOLAS P. GODICI

Attesting Officer     Acting Director of the United States Patent and Trademark Office